United States Patent [19]

Bistline et al.

[11] Patent Number: 5,249,741
[45] Date of Patent: Oct. 5, 1993

[54] AUTOMATIC FAN SPEED CONTROL

[75] Inventors: William R. Bistline; William C. Johnson; James M. Peterson, all of Austin, Tex.

[73] Assignee: International Business Machines Corporation, Armonk, N.Y.

[21] Appl. No.: 878,115

[22] Filed: May 4, 1992

[51] Int. Cl.$^5$ ............................................... H02H 3/18
[52] U.S. Cl. .................................. 236/49.3; 62/259.3; 165/80.3; 236/DIG. 9; 361/694; 361/687; 454/184
[58] Field of Search ..................... 236/49.3, DIG. 9; 361/384, 385; 454/184; 357/81; 363/141; 165/80.3, 80.4; 62/186, 259.3

[56] References Cited

U.S. PATENT DOCUMENTS

| 4,722,669 | 2/1988 | Kundert | 417/32 |
| 5,038,320 | 8/1991 | Heath et al. | 364/900 |

FOREIGN PATENT DOCUMENTS

| 0157507 | 10/1985 | European Pat. Off. | 361/384 |
| 58-99821 | 6/1983 | Japan | 361/384 |
| 58-129524 | 8/1983 | Japan | 361/384 |
| 02-54797 | 10/1990 | Japan | 361/384 |

OTHER PUBLICATIONS

*IBM Technical Disclosure Bulletin*, vol. 18, No. 6, Nov. 1975, "Cooling Control", R. A. Enrietto and G. Podhajsky, p. 1705.
*IBM Technical Disclosure Bulletin*, vol. 20, No. 8, Jan. 1978, "Computerized Control of Chilled Water System", p. 2981.
*IBM Technical Disclosure Bulletin*, vol. 32, No. 10A, Mar. 1990, "Variable Air Cooling for Computer And-/Or Electronic Equipment", p. 196.

*Primary Examiner*—William E. Wayner
*Attorney, Agent, or Firm*—Paul S. Drake

[57] ABSTRACT

A method of cooling a computer having a plurality of components and at least one variable rate cooling unit including the steps of obtaining a cooling requirement for at least one of the components and varying the rate of at least one of the cooling units based on the obtained cooling requirements. In addition an apparatus for cooling a computer having a plurality of components, the apparatus including at least one variable rate cooling unit, an apparatus for obtaining a cooling requirement for at least one of the components, and an apparatus for varying the rate of at least one of the cooling units based on the obtained cooling requirements.

27 Claims, 3 Drawing Sheets

| ID | DESCRIPTION | SPEED VALUE |
|---|---|---|
| B1 | BAY 1 | 0100 |
| B2 | BAY 2 | 0011 |
| F1 | FAN 1 | 0111 |
| F2 | FAN 2 | 0111 |
| 00 | HARD DISK | 0010 |
| 01 | | |
| 02 | MODEM | 0001 |
| 03 | | |
| 98 | GRAPHICS ADAPTER | 0111 |
| 99 | | |

AUTOMATIC FAN SPEED CONTROL

DESCRIPTION

1. Technical Field

The present invention relates to computer system cooling and more particularly to automatic speed control of fans used for cooling a computer system.

2. Background Art

Computer systems include electronic equipment that produces heat when used. The amount of heat produced varies depending upon the type of equipment being utilized. For example, a high speed graphics adapter may produce a large amount of heat whereas a slow speed modem may produce a small amount of heat. If this heat is allowed to build up inside the computer, the electronic equipment may start producing errors and the lifetime of the electronic equipment may be shortened substantially. As a result, computer systems often utilize one or more fans to provide cooling of the electronic equipment. Often these fans are preset to a predetermined speed at the factory to provide a fixed amount of cooling.

However, fans produce a large amount of acoustic noise that is undesirable and may decrease the efficiency of the user utilizing the equipment or of others within the work environment. As a result, many computer systems now contain a variable speed fan. The speed of the fan is varied to minimize the noise generated by the fan while providing adequate cooling for the electronic equipment.

Various types of variable speed fan systems are utilized in the art. One common approach is to utilize a thermistor within the fan hardware to detect changing air temperature inside the computer and then vary the fan speed accordingly. An example of this is provided in "Variable Air Cooling for Computer And/Or Electronic Equipment" in IBM Technical Disclosure Bulletin Vol. 32, No. 10A, March 1990. The difficulty with using a thermistor is that the location of the thermistor may impact the accuracy of the temperature reading, the thermistor will detect a temperature rise some period of time after the temperature has already risen, and thermistors tend to degrade in performance over time.

Another popular approach for varying the speed of a fan is to vary the speed based upon the amount of current drawn from the computer power supply. As more current is drawn from the power supply more heat is generally generated by the computer system and greater cooling is required. However, this approach has several drawbacks. It is expensive to implement and if there are particularly hot components such as a graphics adapter located within the system, a greater amount of cooling may be required to keep that particular component cool.

The prior art approaches to varying fan speed become less adequate when multiple fans are used. In addition as computer systems become more complex and modular, there may be a greater number of hot spots located in various areas within the computer system that may be cooled by different fans.

DISCLOSURE OF THE INVENTION

The present invention includes a method of cooling a computer having a plurality of components and at least one variable rate cooling unit including the steps of obtaining a cooling requirement for at least one of the components and varying the rate of at least one of the cooling units based on the obtained cooling requirements. In addition, the present invention includes an apparatus for cooling a computer having a plurality of components, the apparatus including at least one variable rate cooling unit, an apparatus for obtaining a cooling requirement for at least one of the components, and an apparatus for varying the rate of at least one of the cooling units based on the obtained cooling requirements.

A further understanding of the nature and advantages of the present invention may be realized by reference to the remaining portions of the specification and the drawings.

BEST MODE FOR CARRYING OUT THE INVENTION

Figures 1, 4:
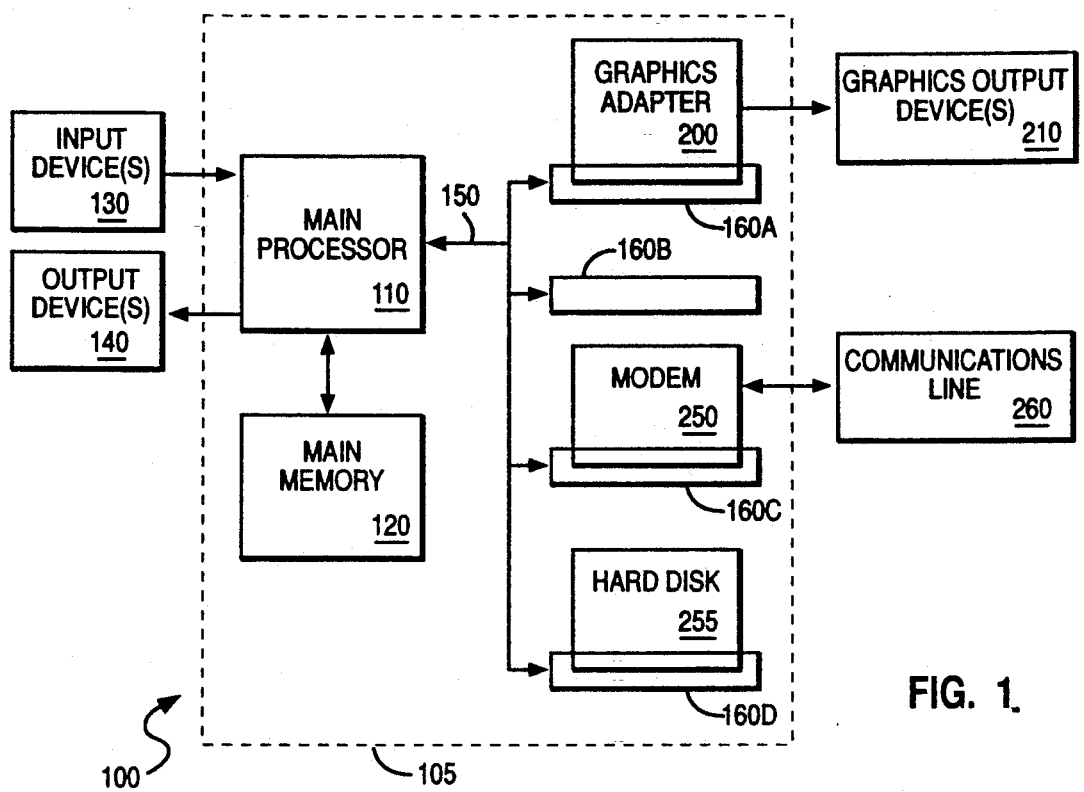
FIG. 1 is a block diagram of a typical digital computer utilized by a preferred embodiment of the invention.
FIG. 4 is an example of a thermal table stored on the hard disk.

FIG. 1 is a block diagram of a typical digital computer 100 utilized by a preferred embodiment of the invention. One computer that could potentially utilize the present invention is the IBM RISC System/6000 (trademark of International Business Machines Corporation). The computer includes a computer box 105 which encloses a main processor or central processing unit (CPU) 110 coupled to a memory 120. The main processor may communicate with input device(s) 130 and output device(s) 140 located outside the computer box 105. Main processor 110 may include a single processor or multiple processors. Memory 120 may generally be expanded in amount by adding more memory cards. Input device(s) 130 may include a keyboard, mouse, tablet or other types of input devices. Output device(s) 140 may include a text monitor, plotter or other types of output devices.

The main processor may also be coupled within computer box 105 to multiple input/output (I/O) slots 160A, 160B, 160C and 160D via bus 150. Bus 150 may be a standard bus such as the Micro Channel (trademark of International Business Machines Corporation). More or fewer I/O slots may be provided depending upon the computer system. The multiple I/O slots provide the capability to insert various option cards into the computer system which would then communicate with the main processor via bus 150.

An example of an option card inserted into the I/O slots would be a graphics adapter 200 which would be attached to a graphics output device such as a graphics display or plotter 210. Graphics adapter 200 would then receive instructions regarding graphics from main processor 110 on bus 150. The graphics adapter then executes those instructions and provides the results to the graphics output device 210 thereby rendering the desired graphics output from the main processor.

Another example of an option card inserted into an I/O slot would be a modem 250 which would then be attached to a communications line 260 such as a telephone line. Modem 250 would then receive instructions from main processor 110 to initiate communications over the communication lines 260 to a similarly configured computer system. The modem would then establish the desired communications link and provide communication from the main processor to the other computer system as well as provide communication from the other system to the main processor. Modem 250 may also receive requests from other computer systems over communications line 260 to initiate communications with main processor 110.

Many other types of option cards may be utilized in the I/O slots 160A–160D such as hard disk 255 or memory cards. Hard disk 255 represents a hard disk adapter plugged into the I/O slot in combination with a hard disk drive located next to the adapter. In general any of the option cards may be inserted into any of the available I/O slots. In addition, some option cards may be hotter than others and greater cooling may be needed for that area of the computer system. Cooling is generally required for all electronic devices included in the computer box 105.

Figure 2:
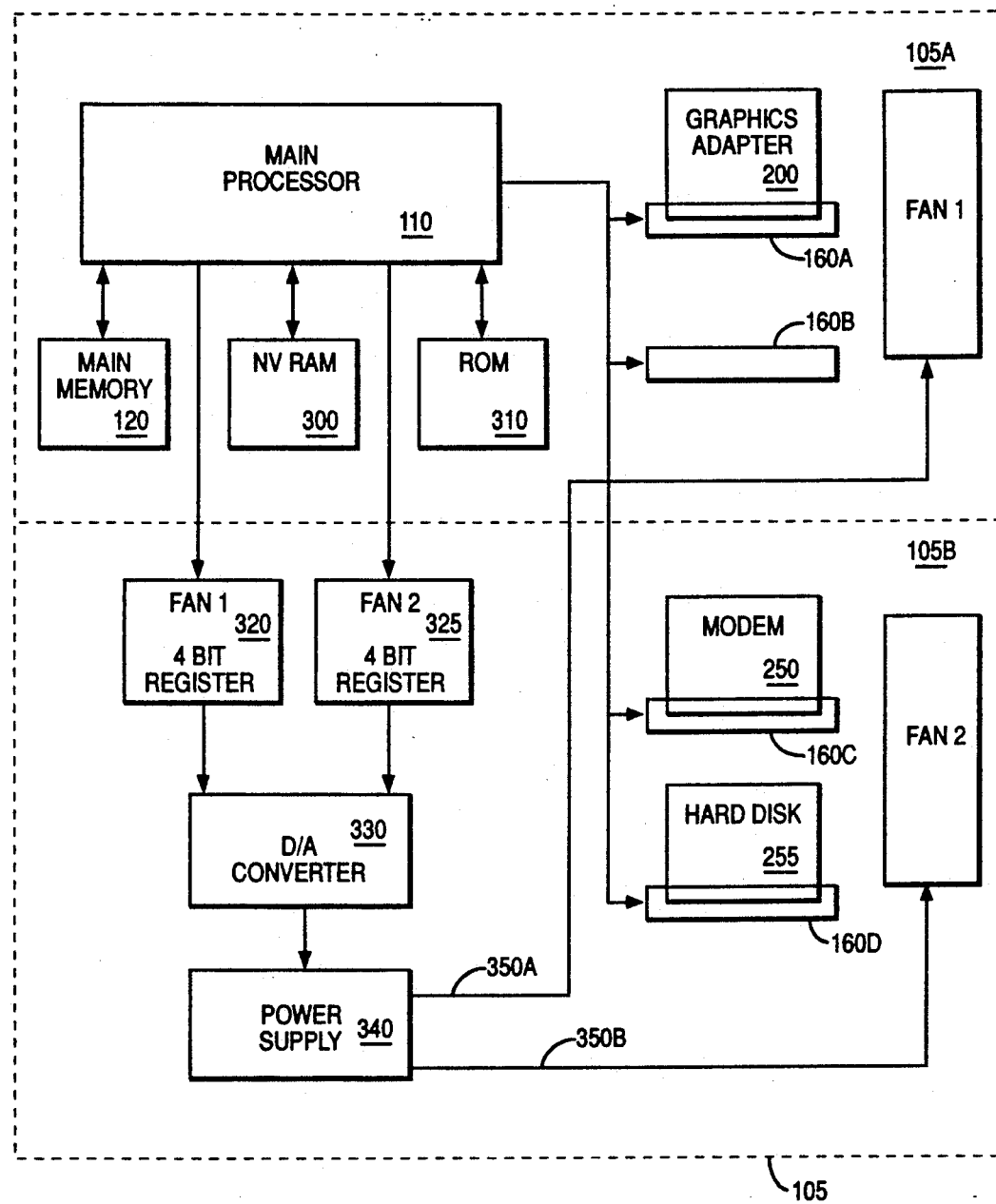
FIG. 2 is a detailed block diagram of the computer system of FIG. 1 illustrating a preferred cooling system used to cool the system.

FIG. 2 is a detailed block diagram of the computer system of FIG. 1 illustrating the cooling system used to cool the computer system. For illustrative purposes, the computer box 105 includes two bays or open areas 105A and 105B. In this example, each bay is thermally separated from the other bay thereby requiring separate fans for cooling. Bay 105A includes fan 1 and bay 105B includes fan 2, each fan providing the necessary cooling for the components included in that bay. Fan 1 cools the main processor 110, main memory 120, NVRAM (non-volatile RAM which is generally powered by a battery when the computer is turned off) 300, ROM 310, I/O slot 160A with the graphics adapter 200 and any component inserted into I/O slot 160B. Fan 2 cools registers 320 and 325, D/A (digital to analog) converter 330, power supply 340, I/O slot 160C with modem 250 and I/O slot 160D with hard disk 255.

Each fan's speed is varied based upon the power provided to the fan by the power supply. That is, the speed of fan 1 is controlled by the voltage on power line 350A and the speed of fan 2 is controlled by the voltage on power line 350B. For example a voltage of 16 volts D.C. will run a fan at full speed whereas a voltage of 8 volts D.C. will run the same fan at half speed. In the preferred embodiment, the speed for each of the fans is stored in registers 320 and 325. Each register contains a 4 bit number, called a speed value, which designates the speed for the respective fan. In alternative embodiments, more or fewer bits may be used to designate the speed value. The speed value stored in each of the registers is converted to an analog value for input to the power supply 340. The power supply then provides the designated amount of voltage to each of the respective fans thereby controlling the amount of cooling performed by that fan.

Figure 3:
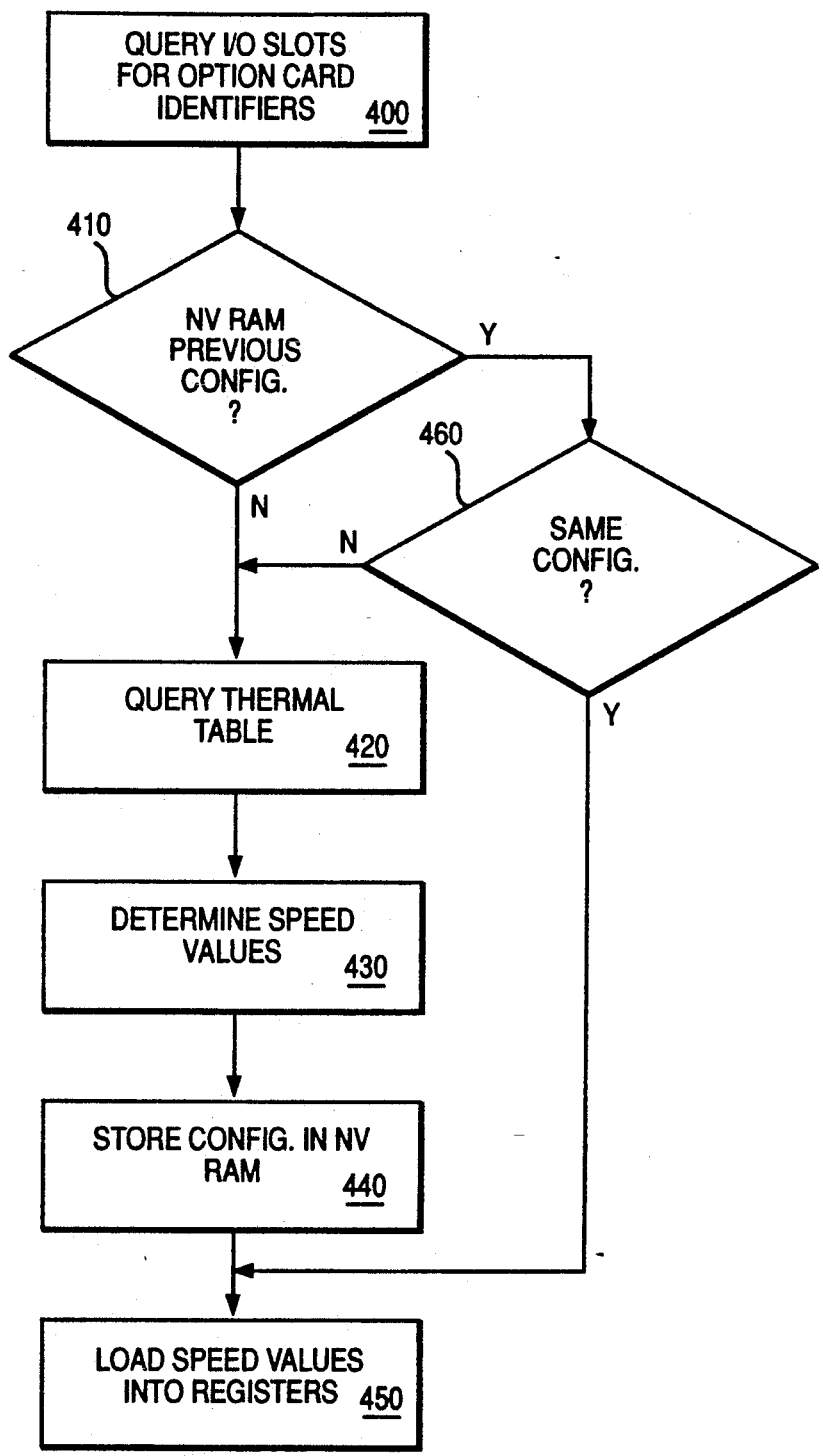
FIG. 3 is a flowchart illustrating how the speed values are determined for each fan.

FIG. 3 is a flowchart illustrating how the speed values for each fan are determined in the preferred embodiment. FIG. 3 will be described with reference to FIG. 2 for illustrative purposes. When the computer system is booted or powered up by the user, an initial program load program stored in ROM (read-only memory) 310 is used to initiate the processing of the computer. In the preferred embodiment IPLROS (initial program load read only storage) stored on ROM is utilized to boot the computer system. IPLROS is similar to BIOS used in many personal computers today. In the preferred embodiment, IPLROS is also used to determine the speed value for each of the fans during the computer boot. This is due to the fact that option cards are generally moved, added or removed while the system is turned off.

In step 400, The IPLROS may query the I/O slots to determine what option cards may be in the I/O slots. As a result of this polling an option card identifier is obtained for each of the I/O slots containing an option card. In the preferred embodiment, the option card identifier is a two byte identifier and may be obtained as taught in Heath et al. (U.S. Pat. No. 5,038,320). In step 410, the NVRAM 300 is then queried to determine if a previous configuration for the computer is stored there. If not, as will be explained below, then this is probably the first time the computer system has been booted and the speed value for each of the fans needs to be determined.

In step 420, a thermal table is queried to determine the base cooling requirements for each bay of the computer system and the cooling requirements for each of the components. In the preferred embodiment, the thermal table is stored on the hard disk when the computer system is manufactured and the thermal table may be updated by updates in the operating system or the like. In alternative embodiments, the thermal table may be stored in NVRAM or in ROM and may be updated by updates in the operating system. The updates to the thermal table may be stored in NVRAM or on the hard disk. In the preferred embodiment, the thermal table provides a 4 bit value representing the minimum cooling requirement for each bay of a base configured system including the memory and main processor. The thermal table also provides a 4 bit value representing the cooling requirement for each possible option card. The thermal table may also provide a 4 bit value representing a minimum speed for each fan regardless of what the thermal requirements may be for the respective bay (fans have generally have minimum start up speeds). In step 420, if there is no corresponding entry in the thermal table for an option card then the IPLROS will designate a default value, preferable full speed, for the unknown option card. In an alternative embodiment, the user may designate a speed value for the unknown option card.

In step 430, the speed value for each of the fans is then determined. In the preferred embodiment, the base cooling requirement for each bay and the cooling requirements for each of the components in the bay are accumulated to provide the speed value. An example of this is described with reference to FIG. 4 below. Once the speed values are determined then in step 440, the system configuration, including the location of the option cards and the speed values for each fan are stored in NVRAM for future reference. Then in step 450, the speed values are stored in four bit registers which value is then converted by a digital-to-analog converter into an analog value. This analog value is then provided to the power supply for each fan thereby setting the speed of that fan.

If in step 410 a previous configuration was stored in NVRAM, then in step 460 the current configuration is compared to the previous configuration including location of the various options cards to determine if the configuration has changed. If the configuration has changed, then the speed values need to be determined and processing continues to step 420. If the configuration is the same, then the previously determined speed values may be used again and processing continues to step 450.

FIG. 4 is an example of a thermal table stored on the hard disk. In the present example B1 and B2 are used to represent the base cooling requirement or speed values for each of the bays. According to the table, B1 or bay 1 would require a speed value of at least 0100 to cool the main processor and memory and B2 or bay 2 would require a speed value of at least 0011 to cool the power supply. In addition F1 and F2 or fan 1 and fan 2 have a minimum speed of 0111.

In the preferred embodiment, the speed values for each bay is determined by accumulating the base cooling requirement or speed value with the cooling requirements or speed values for each of the option cards. According to the table bay 1 would have a speed value of 0100 for the base bay plus 0111 for the graphics adapter resulting in a total speed value of 1011 for fan 1 or about 11 volts for a 16 volt fan. Bay 2 would have a speed value of 0011 for the base bay plus 0010 for the hard disk and 0001 for the modem resulting in a total speed value of 0110 for fan 2 or about 6 volts for a 16 volt fan. However, 0110 is below the minimum speed for fan 2 (0111 as discussed above) so the speed value for fan 2 is set to 0111 or about 7 volts for a 16 volt fan.

If the two bays were not totally thermally separated, then a weighted average of the cooling requirements for each bay may be used to determine the speed values for each fan. In addition, if the total cooling requirement for any bay exceeds the capability of the fans, then the user may be notified by the system to move the option cards to a compliant condition.

Although the present invention has been fully described above with reference to specific embodiments, other alternative embodiments will be apparent to those of ordinary skill in the art. For example, other portions of the computer system besides the I/O slots, such as the CPU chip when the CPU chip may be replaced, may be queried to determine the appropriate speed values for the respective fans. In addition, other cooling technologies such as water cooling may be utilized with the present invention. These alternative cooling technologies may preferably be variable speed for acoustic reasons or possibly to lessen wear on cooling system components such as a water pump. Therefore, the above description should not be taken as limiting the scope of the present invention which is defined by the appended claims.

What is claimed is:

1. A method of cooling a computer having a plurality of components and at least one variable rate a fan cooling unit comprising the steps of:
   a) obtaining a predetermined cooling requirement for at least one of said components; and
   b) varying the rate of at least one of said cooling units based on the obtained cooling requirements.

2. The method of claim 1 wherein the step of obtaining includes the steps of:
   a) querying said components for component identifiers; and
   b) using said identifiers to obtain cooling requirements for said components.

3. The method of claim 2 wherein said step of varying includes the steps of:
   a) determining for at least one of said cooling units the cooling requirements for components cooled by said cooling unit; and
   b) setting the rate of at least one of said cooling units based on the determined cooling requirements.

4. The method of claim 3 wherein said step of determining includes accumulating for each cooling unit the cooling requirements for components cooled by said cooling unit.

5. The method of claim 3 wherein said step of determining includes determining for each cooling unit the weighted average of the cooling requirements for components cooled by said cooling unit.

6. An apparatus for cooling a computer having a plurality of components, said apparatus comprising:
   a) at least one variable rate cooling unit;
   b) means for obtaining a predetermined cooling requirement for at least one of said components; and
   c) means for varying the rate of at least one of said cooling units based on the obtained cooling requirements.

7. The apparatus of claim 6 wherein the means for obtaining includes:
   a) means for querying said components for component identifiers; and
   b) using said identifiers to obtain cooling requirements for said components.

8. The apparatus of claim 7 wherein said means for varying includes:
   a) means for determining for at least one of said cooling units the cooling requirements for components cooled by said cooling unit; and
   b) means for setting the rate of at least one of said cooling units based on the determined cooling requirements.

9. The apparatus of claim 8 wherein said means for determining includes means for accumulating for each cooling unit the cooling requirements for components cooled by said cooling unit.

10. The apparatus of claim 8 wherein said means for determining includes means for determining for each cooling unit the weighted average of the cooling requirements for components cooled by said cooling unit.

11. A computer system comprising:
    a) a plurality of components including a main processor and a memory; and
    b) a cooling system for cooling said plurality of components, said cooling system including:
        i) at least one variable rate cooling unit;
        ii) means for obtaining predetermined cooling requirements for at least one of said components; and
        iii) means for varying the rate of at least one of said cooling units based on the obtained cooling requirements.

12. A computer system comprising:
    a) a plurality of components including a main processor and a memory; and
    b) a cooling system for cooling said plurality of components, said cooling system including:
        i) at least one variable rate cooling unit;
        ii) means for obtaining predetermined cooling requirements for at least one of said components, said means for obtaining including:
        means for querying said components for component identifiers; and
        using said identifiers to obtain cooling requirements for said components; and
        iii) means for varying the rate of at least one of said cooling units based on the obtained cooling requirements.

13. The computer system of claim 12 wherein said means for varying includes:
   a) means for determining for at least one of said cooling units the cooling requirements for components cooled by said cooling unit: and
   b) means for setting the rate of at least one of said cooling units based on the determined cooling requirements.

14. The computer system of claim 13 wherein said means for determining includes means for accumulating for each cooling unit the cooling requirements for components cooled by said cooling unit.

15. The computer system of claim 13 wherein said means for determining includes means for determining for each cooling unit the weighted average of the cooling requirements for components cooled by said cooling unit.

16. The computer system of claim 11 wherein the means for obtaining includes:
   a) means for querying said components for component identifiers; and
   b) using said identifiers to obtain cooling requirements for said components.

17. The computer system of claim 16 wherein said means for varying includes:
   a) means for determining for at least one of said cooling units the cooling requirements for components cooled by said cooling unit; and
   b) means for setting the rate of at least one of said cooling units based on the determined cooling requirements.

18. The computer system of claim 17 wherein said means for determining includes means for accumulating for each cooling unit the cooling requirements for components cooled by said cooling unit.

19. The computer system of claim 17 wherein said means for determining includes means for determining for each cooling unit the weighted average of the cooling requirements for components cooled by said cooling unit.

20. A method of cooling a computer having a plurality of components and at least one variable rate cooling unit comprising the steps of:
   a) obtaining a cooling requirement for at least one of said components including the steps of:
      i) querying said components for component identifiers; and
      ii) using said identifiers to obtain cooling requirements for said components; and
   b) varying the rate of at least one of said cooling units based on the obtained cooling requirements.

21. The method of claim 20 wherein said step of varying includes the steps of:
   a) determining for at least one of said cooling units the cooling requirements for components cooled by said cooling unit; and
   b) setting the rate of at least one of said cooling units based on the determined cooling requirements.

22. The method of claim 12 wherein said step of determining includes accumulating for each cooling unit the cooling requirements for components cooled by said cooling unit.

23. The method of claim 21 wherein said step of determining includes determining for each cooling unit the weighted average of the cooling requirements for components cooled by said cooling unit.

24. An apparatus for cooling a computer having a plurality of components, said apparatus comprising:
   a) at least one variable rate cooling unit;
   b) means for obtaining a cooling requirement for at least one of said components, said means for obtaining including:
      i) means for querying said components for component identifiers; and
      ii) using said identifiers to obtain cooling requirements for said components; and
   c) means for varying the rate of at least one of said cooling units based on the obtained cooling requirements.

25. The apparatus of claim 24 wherein said means for varying includes:
   a) means for determining for at least one of said cooling units the cooling requirements for components cooled by said cooling unit; and
   b) means for setting the rate of at least one of said cooling units based on the determined cooling requirements.

26. The apparatus of claim 25 wherein said means for determining includes means for accumulating for each cooling unit the cooling requirements for components cooled by said cooling unit.

27. The apparatus of claim 25 wherein said means for determining includes means for determining for each cooling unit the weighted average of the cooling requirements for components cooled by said cooling unit.

* * * * *